April 17, 1973 P. H. BARDELL, JR., ET AL 3,728,166
SEMICONDUCTOR DEVICE FABRICATION METHOD
AND PRODUCT THEREBY
Filed Jan. 11, 1967 2 Sheets-Sheet 1

INVENTORS
PAUL H. BARDELL JR.
FRED BARSON
CHARLES E. BENJAMIN
RAYMOND P. PECORARO
BY Harry M Weiss
ATTORNEY April 17, 1973 P. H. BARDELL, JR., ET AL 3,728,166

SEMICONDUCTOR DEVICE FABRICATION METHOD AND PRODUCT THEREBY

Filed Jan. 11, 1967 2 Sheets-Sheet 2

United States Patent Office 3,728,166

Patented Apr. 17, 1973

3,728,166

SEMICONDUCTOR DEVICE FABRICATION METHOD AND PRODUCT THEREBY

Paul H. Bardell, Jr., Poughkeepsie, Fred Barson, Wappingers Falls, Charles E. Benjamin, Poughkeepsie, and Raymond P. Pecoraro, Wappingers Falls, N.Y., assignors to International Business Machines Corporation, Armonk, N.Y.

Filed Jan. 11, 1967, Ser. No. 608,628
Int. Cl. H01l *7/34;* B01j *17/00*
U.S. Cl. 148—175 7 Claims

ABSTRACT OF THE DISCLOSURE

This is a method for reliably reproducing, on the surface of an epitaxially grown monocrystalline layer, a pattern that was formed on the surface of the substrate on which the epitaxial layer was grown. By using a substrate having a {100.} crystallographic orientation, the {100.} epitaxial grown layer reproduces the pattern on the substrate surface directly above the substrate surface pattern. This permits accurate alignment that is necessary for any subsequent process operation, such as diffusion, to be accurately performed thereby increasing the yield in the manufacture of, for example, integrated semiconductor devices.

BACKGROUND OF THE INVENTION

Field of the invention

This invention relates generally to a method for fabricating semiconductor devices and the products produced thereby and, more particularly, to a method for forming distortion free, epitaxially grown, monocrystalline semiconductor surfaces to reliably reproduce a pattern directly above the initially formed pattern on the starting semiconductor substrate surface to facilitate further semiconductor processing especially useful in the formation of semiconductor devices.

Description of the prior art

In fabricating monolithic semiconductor structures where a very high concentration of active (transistors, diodes, etc.) or passive (resistors, capacitors, etc.) devices are formed in a single monocrystalline semiconductor chip to provide one or a number of electrical circuits, it is essential, when using an epitaxially grown monocrystalline layer in the device fabrication process, to know precisely where various buried regions appear in the starting substrate surface below the epitaxially grown layer. Buried subcollector regions, for example, are very often formed in a substrate surface to reduce the epitaxially grown collector impedance or the effective sheet resistance in the collector without degrading the collector voltage and capacitance characteristics. This subcollector region is usually formed by a diffusion operation wherein a high concentration of impurities of the desired conductivity type material are diffused into one or more regions of a substrate surface prior to epitaxial growth on the substrate surface. The impurity chosen, desirably, has a very low diffusion coefficient so that the subcollector region will substantially remain in its originally diffused position with only a portion thereof outdiffused into the epitaxially grown layer.

For example, in forming PN junction isolated active or passive devices in a monolithic semiconductor structure, each device should usually be formed over the subcollector region to take advantage of the function of this region. However, it is essential to know the precise location of each subcollector region after an epitaxial layer has been grown over the subcollector region to permit isolation diffusions to be performed which serve to electrically isolate specific portions of the epitaxially grown layer above each subcollector region. Similarly, in some situations it may be desirable to form isolated epitaxial regions by using the outdiffusion of regions that were initially formed as diffused regions in the substrate in cooperation with matching isolation diffusions in the epitaxial layer. In these cases, it is essential to precisely match up the isolation diffusions in the epitaxial layer with the previously formed diffused regions in the substrate.

One technique that is used to locate the position of the subcollector region after an epitaxial layer is formed on a silicon substrate is to provide, by means of a thermally grown silicon dioxide layer, a depression on the substrate surface where the diffused subcollector region is located so that the surface of the epitaxially grown layer will have a similar recess to facilitate the formation of active or passive devices above the subcollector region by subsequent semiconductor fabrication steps. Additionally, the location of this recess on the epitaxially grown surface facilitates the formation of a PN junction isolated device by a subsequent diffusion operation to form about the recess a continuous region of the same conductivity type as the initial substrate so as to electrically isolate each device from the other devices in the monolithic structure.

However, the depressed or recessed pattern is not faithfully reproduced, after epitaxial growth, directly about the initially formed recess on the substrate surface. One or more edges of the recessed pattern are usually smeared out which is known in the art as a "wash-out" pattern problem. Another serious problem associated with the formation of a pattern on the surface of the epitaxially grown semiconductor layer is that there is an actual undesired transverse shift in the pattern. This "offset" pattern problem, as it is so called in the art, results in the improper formation of devices and the faulty formation of PN junction isolated structures. These "wash-out" and "offset" pattern problems make fabrication of very dense monolithic devices or circuits very difficult to achieve.

Accordingly, it is an object of this invention to provide an improved method for forming semiconductor devices.

It is another object of this invention to provide a method for overcoming the "wash-out" and "offset" problems associated with pattern formation on the surface of an epitaxially grown layer that is used for fabricating monolithic integrated semiconductor structures.

SUMMARY OF THE INVENTION

In accordance with an embodiment of this invention, a method is described for reproducing a pattern on the surface of an epitaxial layer substantially identical to an initially formed pattern on an underlying semiconductor substrate surface. The method comprises forming a semiconductor substrate having a surface crystallographic orientation parallel to a {100} plane. A pattern having raised and recessed portions is formed on the semiconductor substrate. A monocrystalline layer having a {100} crystallographic orientation is epitaxially grown on the substrate surface thereby reproducing on the surface of the epitaxially grown layer the pattern formed on the substrate surface. A semiconductor device is formed in the epitaxial layer using the pattern formed on the surface of the epitaxially grown layer.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
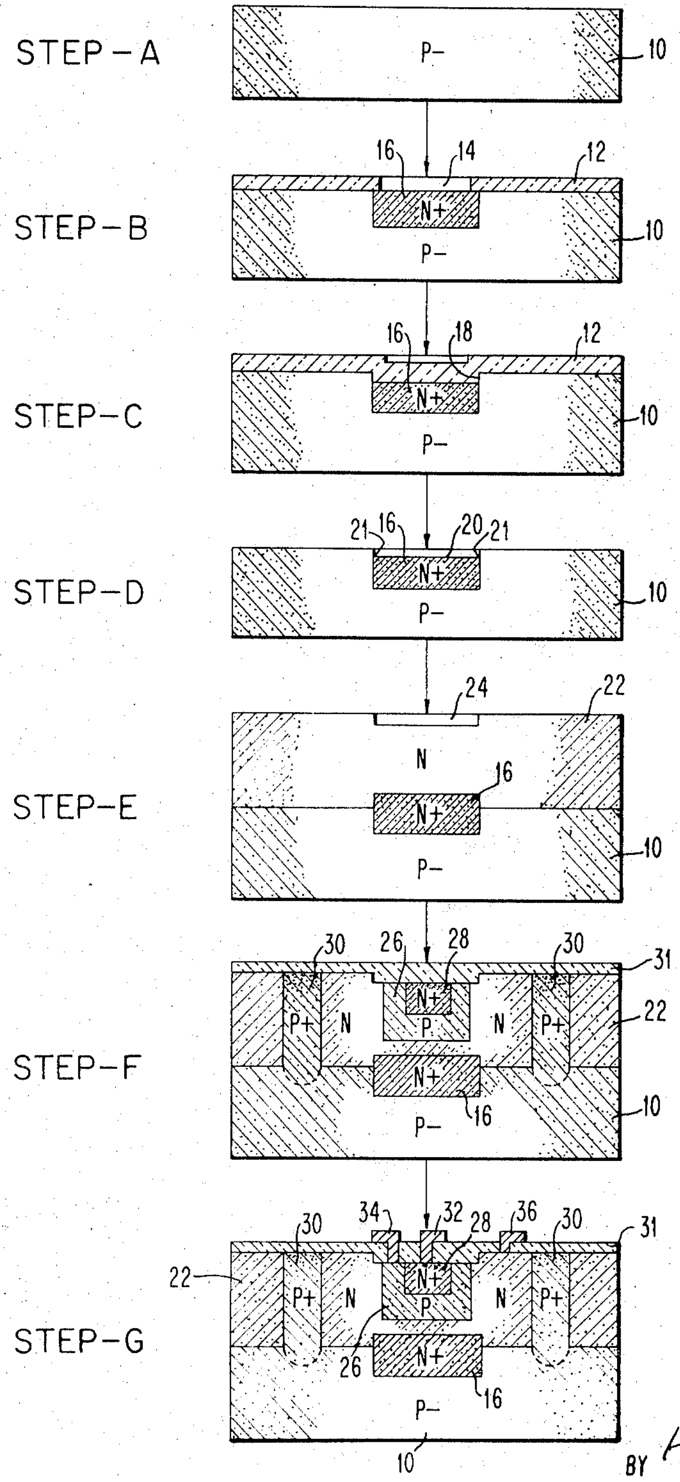
FIG. 1 is a flow diagram, in cross-section, depicting the steps in the fabrication of a semiconductor device in accordance with the method of this invention.

Referring to the drawing, Step A depicts a portion of a starting wafer or substrate 10 of semiconductor material which is shown for the purposes of illustration as being of P− type conductivity. It should be evident to those skilled in the art that the conductivity type shown in the drawing is selected for illustrative purposes only and that the opposite conductivity type can be used. In addition, the concentration of impurities can be increased or decreased as desired. The P− wafer or substrate 10 preferably has a resistivity of from 10 to 20 ohm-centimeter. The substrate 10 is a monocrystalline semiconductor structure which is fabricated by pulling a monocrystalline rod from a suitably doped melt with P type material such as boron using a seed with a {100} orientation. In this manner, the pulled rod has a {100} orientation and hence, wafers sliced from the rod will likewise have a surface with a {100} orientation. Rods have been pulled in the past with various crystallographic orientations such as the {111}, but it is critical for this process that the starting substrate or wafer have a {100} crystallographic orientation. For purposes of disclosure the semiconductor material described is silicon, but it is evident that the materials such as germanium or intermetallic semiconductor materials can be used.

In Step B, an insulating or silicon dioxide layer 12 is formed on a semiconductor surface of the silicon substrate 10 which is, for example, about 8 mils thick and by conventional photolithographic masking and etching techniques, using photo-resist, an opening 14 is formed in the oxide layer 12. Various insulating materials can be used such as alumina, silicon nitride, etc. which can be deposited or R. F. sputtered, if desired. Preferably, the silicon dioxide layer is thermally grown to, for example, a thickness of 5200 angstrom units. By a diffusion operation, an $N^+$ region 16 is formed in the substrate 10 beneath the opening 14. The preferably square or rectangular $N^+$ diffused region 16 desirably has a $C_0$ of about $2\times10^{20}$ cm.$^{-3}$ which can be formed using an arsenic source, for example. It is evident that this $N^+$ region 16 can also be formed by an etch and refill technique using the process of etching out a surface portion of the substrate 10 and then refilling it with epitaxial material of $N^+$ type conductivity. A process illustrating this technique is described in U.S. patent application S.N. 454,257, filed May 10, 1965, entitled "Semiconductor Device Arrangement and Fabrication Method Therefor" and assigned to the same assignee as this invention. After such an etch and refill operation an insulating layer could be formed on the semiconductor surface with an opening therein corresponding to opening 14 in Step B.

Referring to Step C, a thermal oxidation operation is performed, for example, with an oxidation cycle of 10 minutes in dry $O_2$ and 30 minutes in steam at 1150° C. The additional oxide thickness of oxide layer 12 is available with a thicker oxide layer being formed on the bare $N^+$ region 16 and a thinner oxide layer formed over the remainder of the substrate surface due to the shielding effect of the initial oxide layer which inhibits the conversion of silicon into silicon dioxide during the thermal growth process. Hence, step 18 is formed in the substrate 10 on the $N^+$ region 16. The same step 18 can be formed on the $N^+$ region 16 by an etching operation, if desired.

Referring to Step D, the substrate 10 has a flat recessed portion 20 formed on the $N^+$ region 16 after the oxide layer 12 has been stripped or etched off the surface by conventional oxide removal techniques. This flat recessed portion 20 is parallel to the substrate surface and hence, has a {100} crystallographic orientation. However, edge portions 21 defining the flat recessed portion 20 are preferably oriented parallel to a crystal orientation that has a four fold symmetry like the ⟨110⟩ crystallographic direction. The edges 21 of the flat recessed portion 20 can be aligned parallel to the ⟨110⟩ direction, for example, by proper mask alignment using a reference flat edge portion formed in the proper crystallographic orientation that was previously formed or cut along a longitudinal surface portion of the pulled monocrystalline rod. This reference flat edge portion can be properly cut along the desired orientation by using X-ray or other crystallographic orientation aids.

Alternatively, instead of using a recess pattern on the substrate surface to designate the subcollector region 16, a raised or elevated pattern can be formed to designate the subcollector region 16 by the previously described etching or thermal oxide growth and removal techniques applied to the remaining portion of the substrate surface, but not to the surface of the subcollector region 16. In this manner, by removing all of the semiconductor substrate surface around the surface portion of the subcollector region 16, a raised or elevated portion is formed which permits subsequent identification of the subcollector region as does the recess portion shown in Step D of FIG. 1. In this example, the edges forming the elevated portion are preferably oriented, like the edges 21 of the recessed flat portion 20, parallel to the ⟨110⟩ crystallographic direction.

With reference to Step E, an epitaxial layer 22 of N type conductivity having, for example a resistivity of about 0.2 ohm-centimeter, is grown on the substrate 10 thereby forming a recess 24 on the surface of the epitaxial layer 22 directly above the previously formed recess in the substrate surface.

In having the edges parallel to the ⟨110⟩ crystallographic direction, the epitaxially grown layer 22 which is grown on the {100} crystallographic orientation, reliably reproduces the initial substrate surface pattern on the surface of the epitaxial layer 22 with the center of the recess 24 exactly coinciding with the center of the initial recess formed on the substrate surface. The centers of the recesses are in exact alignment because of the selection of the edges to be parallel to the ⟨110⟩ crystallographic direction thereby providing symmetry to the recess formed on the epitaxial layer with respect to the initially formed recess. Hence, any "wash-out" or "off-set" that might occur for the pattern on the surface of the epitaxial layer 22 will be of a symmetrical nature thereby permitting accurate mask alignment with the knowledge that the center of the recess 24 on the epitaxially grown layer 22 will be directly above the center of the initially formed recess on the substrate surface.

In Step F, by using the recssed portion 24 for mask alignment purposes, an active transistor device, for example, is formed by conventional base and emitter diffusion operations to form base region 26 and emitter region 28 in the epitaxial layer 22 which is, for example, approximately 5.5 to 6.5 microns thick. It should be evident to those skilled in the art that a resistor or capacitor or diode or other device can be formed above the subcollector region, if desired. The base region 26 has, for example, a $C_0$ of $5\times10^{20}$ cm.$^{-3}$. The emitter region, for example, has a $C_0$ of about $10^{21}$ phosphorous impurities per cm.$^{-3}$. For fabricating PN junction isolated devices, a $P^+$ diffusion forms an isolating wall 30 about the transistor device. The depth of the isolating wall 30 reaches the P− substrate 10 thereby effectively isolating the semiconductor device formed in the epitaxial region 22. Preferably, the $P^+$ isolation diffusion step is carried out prior to the base and emitter diffusion operations. During the isolated device fabrication process, the subcollector region 16 outdiffuses about one micron into the epitaxial layer 22.

In Step G, after a final oxide layer 31 (Step F) is formed on the surface of the epitaxial layer 22, ohmic contacts 32, 34, and 36 are applied to the emitter 28, base 26, and collector 22 regions by the conventional technique, for example, of opening up holes in the oxide layer 31, depositing a metal layer on the oxide layer 31, and subtractively etching away the deposited metal layer to form the desired contacts. The P-type isolation region is reverse biased by an electrode (not shown) in the usual fashion to electrically isolate the transistor device shown in Step G of FIG. 1. It is readily apparent that the described process is applicable for making very dense monolithic semiconductor structures, but, for purposes of illustration, only one fabricated semiconductor device is shown by FIG. 1. It is also apparent that a PNP transistor device or other semiconductor devices can be formed using the teachings of this process.

Figure 2:
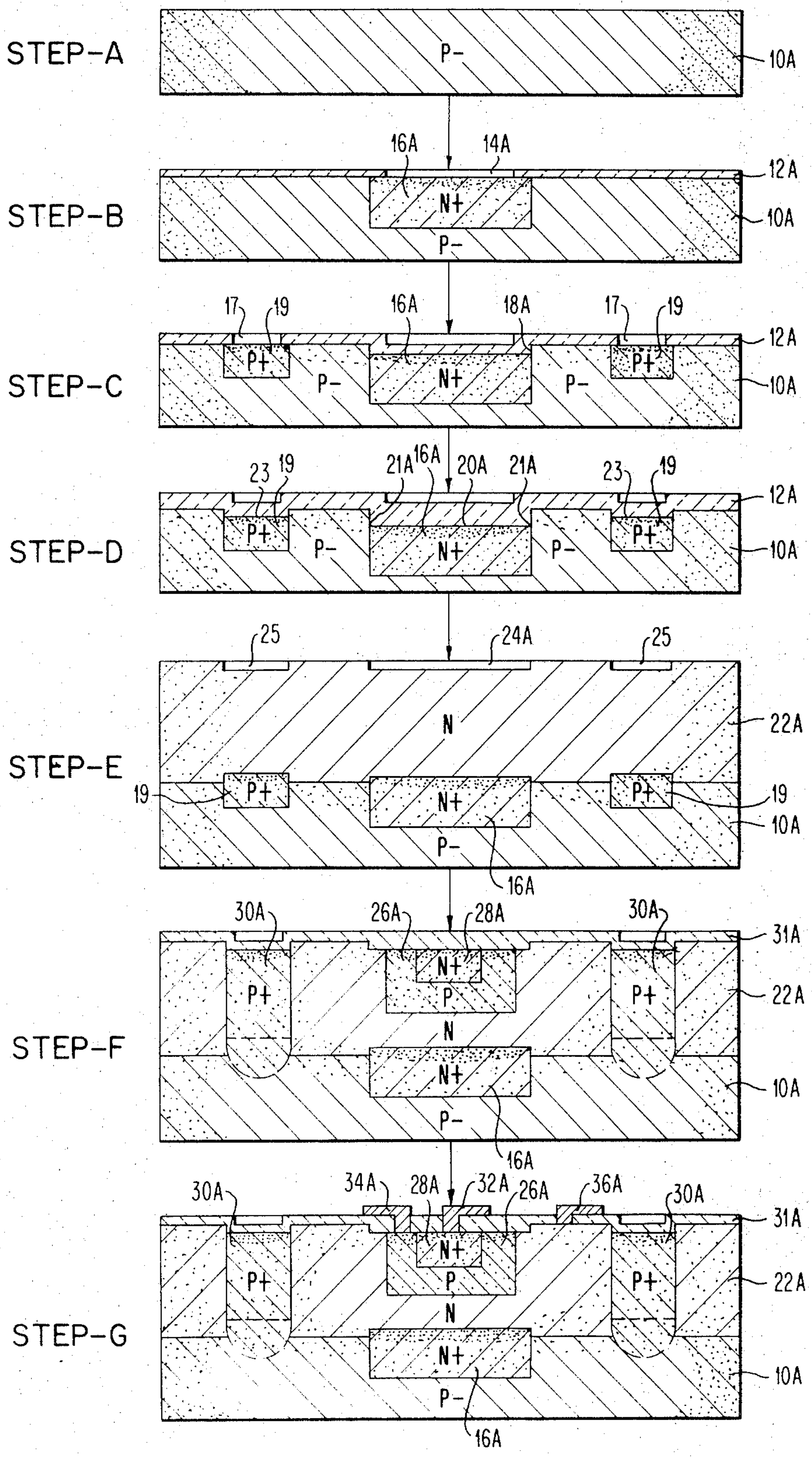
FIG. 2 is a flow diagram, in cross-section, depicting the steps in the fabrication of a semiconductor device in accordance with another embodiment of this invention.

Referring to FIG. 2, another embodiment of the process of this invention is shown. In this embodiment, the same reference numbers used in FIG. 1 are used to depict the same elements in FIG. 2 with the addition of the letter A.

In Step A, a substrate 10A is fabricated as described in Step A of FIG. 1. Similarly Step B of FIG. 2 is identical to Step B of FIG. 1.

In Step C, after formation of the step 18A as described in Step C of FIG. 1, a substantially continuous opening 17 is formed in the oxide layer 12A by standard photolithographic masking and etching techniques. Preferably, the opening 17 has a polygonal configuration, i.e., rectangular or octagonal. Subsequently, by a diffusion operation a $P^+$ diffused region 19 is formed in the substrate below the continuous opening 17. This $P^+$ region 19 is useful in forming an isolation region (see Step F) about the subsequently fabricated semiconductor device.

In Step D, a recess 23 is formed on the surface of the buried diffused region 19 in the same manner as the recessed flat portion 20A is formed on the surface of the subcollector 16A.

In Step E, an epitaxial layer 22A is grown on the substrate surface in the same manner as in Step E of FIG. 1. Recess 25 on the surface of the epitaxial layer 22A designates the location of the underlying $P^+$ region 19 formed in the substrate 10A. Center recess 24A identifies the location, as in Step E of FIG. 1, of the subcollector region 16A.

In Step F, as in Step F of FIG. 1, base region 26A, emitter region 28A, and continuous isolation region 30A are formed by diffusion operations. In this illustration the continuous isolation region 30A is composed of an outdiffused portion of the diffused region 19 and a diffused region formed through the surface of the epitaxial layer 22A. The matching diffused regions forming diffused regions 30A are permitted by alignment made possible by using recess 25 on the surface of the epitaxial layer 22A.

In Step G, as in Step G of FIG. 1, ohmic contacts 32A, 34A, and 36A are applied to the emitter 28A, base 26A, and collector 22A regions of the fabricated transistor device.

While the above described portion of the specification concerning the use of edges about the recess or elevated portion formed above the buried regions in the substrate were described as being parallel to a {110} crystallographic direction, it is also possible to form the edges parallel to {100} crystallographic direction. Both of these crystallographic directions have a four-fold symmetry which would permit the formation of a pattern on the surface of the epitaxially grown layer with the center thereof being directly above the center of the similarly formed pattern on the substrate surface.

In addition, while the above described process has been specifically directed to the use of a starting substrate having a surface parallel to a {100} crystallographic plane, it may be desirable to have the surface of the substrate from 0 to 10 degrees off the {100} crystallographic plane. Hence, the preferred process is to use a substrate surface substantially parallel to the {100} crystallographic plane, which would include variations of a few degrees off this selected crystallographic plane.

In summary, the pattern reproduced on the surface of the epitaxial layer is similar to the pattern formed on the surface of the substrate. Similar is defined as not differing in shape but only in size, but also includes congruent configurations. Likewise, each pattern substantially possesses the same central axis.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for reproducing a first geometrical pattern on the surface of an epitaxial layer from a second geometrical pattern formed on an underlying semiconductor substrate composed of material having a cubic crystalline structure, the first and second patterns having similar geometrical shapes, and each pattern having a substantially identical central axis, whereby the first geometrical pattern is employed for alignment in subsequent fabrication processing of the epitaxial layer and substrate comprising the steps of:

(a) forming a semiconductor substrate having a surface crystallographic orientation substantially parallel to a {100} plane, (b) forming a pattern having raised and recessed portions defining a surface of said surface, (c) epitaxially growing a monocrystalline layer having a substantially {100} crystallographic orientation on said substrate thereby reproducing on said surface of said epitaxially grown layer the pattern formed on the substrate, and (d) forming a PN junction in said epitaxial layer using said patterns formed on the surface of said epitaxial layer for purposes of alignment.

2. A method for reproducing a first geometrical pattern on the surface of an epitaxial layer from a second geometrical pattern formed on an underlying semiconductor substrate composed of material having a cubic crystalline structure, the first and second patterns having similar geometrical shapes, and each pattern having a substantially identical central axis, whereby the first geometrical pattern is employed for alignment in subsequent fabrication processing of the epitaxial layer and substrate comprising the steps of:

(a) forming a semiconductor substrate having a surface crystallographic orientation substantially parallel to a {100} plane, (b) forming a pattern having raised and recessed portions defining a surface of said surface, (c) epitaxially growing a monocrystalline layer having a substantially {100} crystallographic orientation on said substrate thereby reproducing on said surface of said epitaxially grown layer the pattern formed on the substrate, (d) forming a PN junction in said epitaxial layer using said patterns formed on the surface of said epitaxial layer for purposes of alignment, and (e) forming at least one geometrical configuration with the edges thereof being orientated parallel to the <110> direction.

3. A method for reproducing a first geometrical pattern on the surface of an epitaxial layer from a second geometrical pattern formed on an underlying semiconductor substrate composed of material having a cubic crystalline structure, the first and second patterns having similar geometrical shapes, and each pattern having a substantially identical central axis, whereby the first geometrical pattern is employed for alignment in subsequent fabrication processing of the epitaxial layer and substrate comprising the steps of:

(a) forming a semiconductor substrate having a surface crystallographic orientation substantially parallel to a {100} plane, (b) forming a pattern having raised and recessed portions defining a surface of said surface, (c) epitaxially growing a monocrystalline layer having a substantially {100} crystallographic orientation on said substrate thereby reproducing on said surface of said epitaxially grown layer the pattern formed on the substrate, (d) forming a PN junction in said epitaxial layer using said patterns formed on the surface of said epitaxial layer for purposes of alignment, and (e) forming at least one geometrical configuration with the edges thereof being orientated parallel to the <100> direction.

4. A method for reproducing a first geometrical pattern on the surface of an epitaxial layer from a second geometrical pattern formed on an underlying semiconductor substrate, the first and second patterns having similar geometrical shapes, and each pattern having a substantially identical central axis, whereby the first geometrical pattern is employed for alignment in subsequent fabrication processing of the epitaxial layer and substrate as in claim 2 wherein:

said geometric configuration is a recessed portion in said substrate surface.

5. A method for reproducing a first geometrical pattern on the surface of an epitaxial layer from a second geometrical pattern formed on an underlying semiconductor substrate, the first and second patterns having similar geometrical shapes, and each pattern having a substantially identical central axis, whereby the first geometrical pattern is employed for alignment in subsequent fabrication processing of the epitaxial layer and substrate as in claim 2 wherein:

said geometrical configuration is a raised portion on said substrate surface.

6. A method for reproducing a first geometrical pattern on the surface of an epitaxial layer from a second geometrical pattern formed on an underlying semiconductor substrate, the first and second patterns having similar geometrical shapes, and each pattern having a substantially identical central axis, whereby the first geometrical pattern is employed for alignment in subsequent fabrication processing of the epitaxial layer and substrate as in claim 2 wherein:

said geometrical configuration is a recessed portion in said substrate surface.

7. A method for reproducing a first geometrical pattern on the surface of an epitaxial layer from a second geometrical pattern formed on an underlying semiconductor substrate, the first and second patterns having similar geometrical shapes, and each pattern having a substantially identical central axis, whereby the first geometrical pattern is employed for alignment in subsequent fabrication processing of the epitaxial layer and substrate as in claim 3 wherein:

said geometrical configuration is a raised portion on said substrate surface.

References Cited

UNITED STATES PATENTS

| | | | |
|---|---|---|---|
| 3,146,137 | 8/1964 | Williams | 148—175 |
| 3,149,395 | 9/1964 | Bray et al. | 148—175 X |
| 3,206,339 | 9/1965 | Thornton | 148—175 |
| 3,220,896 | 11/1965 | Miller | 148—33.5 |
| 3,325,314 | 6/1967 | Allegretti | 148—175 |
| 3,366,516 | 1/1968 | McAleer et al. | 148—175 X |
| 3,379,584 | 4/1968 | Bean et al. | 148—175 |
| 3,278,347 | 10/1966 | Topas | 148—175 X |
| 3,316,128 | 4/1967 | Osafune et al. | 148—175 UX |
| 3,366,520 | 1/1968 | Berkenblit et al. | 148—175 X |
| 3,425,879 | 2/1969 | Shaw et al. | 148—175 |
| 3,476,592 | 11/1969 | Berkenblit et al. | 117—201 |

L. DEWAYNE RUTLEDGE, Primary Examiner

W. G. SABA, Assistant Examiner

U.S. Cl. X.R.

29—580; 117—106 A, 201, 212; 148—174; 156—17